(12) United States Patent
He et al.

(10) Patent No.: US 11,705,899 B2
(45) Date of Patent: Jul. 18, 2023

(54) SERIAL IGBT VOLTAGE EQUALIZATION METHOD AND SYSTEM BASED ON AUXILIARY VOLTAGE SOURCE

(71) Applicant: WUHAN UNIVERSITY, Hubei (CN)

(72) Inventors: Yigang He, Hubei (CN); Lie Li, Hubei (CN); Liulu He, Hubei (CN); Chenyuan Wang, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 185 days.

(21) Appl. No.: 16/709,939

(22) Filed: Dec. 11, 2019

(65) Prior Publication Data
US 2020/0403610 A1 Dec. 24, 2020

(30) Foreign Application Priority Data
Jun. 20, 2019 (CN) .......................... 201910539291.4

(51) Int. Cl.
*H03K 17/0812* (2006.01)
*H03K 17/22* (2006.01)
*H03K 17/567* (2006.01)
*G01R 31/26* (2020.01)

(52) U.S. Cl.
CPC ..... *H03K 17/08126* (2013.01); *G01R 31/261* (2013.01); *H03K 17/22* (2013.01); *H03K 17/567* (2013.01); *H03K 2017/226* (2013.01)

(58) Field of Classification Search
CPC .. G01R 31/261; H03K 17/18; H03K 17/0828; H03K 17/08126; H02M 1/088
See application file for complete search history.

(56) References Cited

U.S. PATENT DOCUMENTS

2002/0131276 A1* 9/2002 Katoh ................ H03K 17/0828
363/16
2019/0229723 A1* 7/2019 Nakashima .......... H03K 17/163

\* cited by examiner

*Primary Examiner* — Patrick C Chen
(74) *Attorney, Agent, or Firm* — JCIPRNET

(57) ABSTRACT

A serial IGBT voltage equalization method and system based on an auxiliary voltage source is disclosed. The method includes the following steps. (1) Detect a port dynamic voltage of each serial IGBT. (2) Perform dynamic overvoltage diagnosis respectively on the port dynamic voltage of each IGBT. (3) Supply emergency high level signal to the gate of the IGBT when there is dynamic overvoltage. (4) Stop supplying emergency high level signal to the gate of the IGBT, supply a constant voltage at the gate of the IGBT through the auxiliary voltage source. The invention provides a constant voltage through the auxiliary voltage source, prolongs the off time of the faulty IGBT, and turns off other IGBTs simultaneously, thereby achieving the purpose of serial IGBT voltage equalization.

5 Claims, 2 Drawing Sheets

SERIAL IGBT VOLTAGE EQUALIZATION METHOD AND SYSTEM BASED ON AUXILIARY VOLTAGE SOURCE

CROSS-REFERENCE TO RELATED APPLICATION

This application claims the priority benefit of China application serial no. 201910539291.4, filed on Jun. 20, 2019. The entirety of the above-mentioned patent application is hereby incorporated by reference herein and made a part of this specification.

BACKGROUND

Technical Field

The invention relates to the field of direct current transmission, in particular to a serial IGBT voltage equalization method and system based on an auxiliary voltage source.

Description of Related Art

With the continuous development of domestic economy, in the field of electricity transmission and distribution, HVDC transmission technology has been applied more frequently in the renewable energy grid-connected field, distributed generation grid-connected field, island power supply field, urban grid power supply field, and asynchronous AC grid interconnection field and so on. However, as a key device of DC transmission technology, the bus voltage of the voltage source converter is large, so higher requirements are demanded for the insulation and withstand voltage of the power equipment. At present, IGBT (Insulated Gate Bipolar Transistor) serial technology can effectively solve the defects of low voltage level of single IGBT with low cost and simple structure, thus receiving significant attention.

The main problem with IGBT voltage equalization technology is uneven voltage distribution, and the causes include: 1. inconsistent parameters of the IGBT itself; 2. inconsistent parameters of the peripheral circuits; 3. delay of the driving signal. The uneven voltage distribution may cause a single IGBT to generate excessive voltage, which will at least reduce the service life of the IGBT, or even directly cause damage to the IGBT, and further affect the safety and stability of the whole system.

SUMMARY

The purpose of the present invention to provide a simple and feasible method and system for suppressing overvoltage of a serial IGBT.

The invention provides a serial IGBT voltage equalization method based on an auxiliary voltage source, including the following steps:

(1) detecting the port dynamic voltage of each serial IGBT;

(2) performing dynamic overvoltage diagnosis on the port dynamic voltage of each of the IGBT;

(3) supplying an emergency high level signal to the gate of one of the IGBT when a dynamic overvoltage is detected;

(4) stop supplying an emergency high level signal to the gate of the IGBT, and supplying a constant voltage at the gate of the IGBT through the auxiliary voltage source.

According to the above technical solution, the dynamic overvoltage diagnosis starts diagnosis when a gate voltage of the IGBT reaches a Miller platform.

According to the above technical solution, when a port dynamic voltage of one of the IGBT exceeds a reference voltage by a specific ratio, it is diagnosed as a dynamic overvoltage.

According to the above technical solution, the amplitude of the high level signal is determined by the difference between a high level amplitude of a gate driving signal of the IGBT and a voltage amplitude of a Miller platform of the IGBT.

According to the above technical solution, the signal width of the high level signal is determined by a port voltage diagnosis result of the IGBT, and when the port dynamic voltage of the IGBT is less than or equal to the reference voltage, the high level signal stops.

Further to the above technical solution, in step (4), the auxiliary voltage source starts to operate in a next cycle of stopping supplying the high level signal to the gate of the IGBT.

Further to the above technical solution, the method for determining the constant voltage supplied by the auxiliary voltage source is:

The first detection voltage value $U_a$ is set to be close to 0, and the time when the overvoltage IGBT and the reference port voltage of the IGBT $U_{CE}$ reach the first detection voltage value are recorded, which are respectively recorded as $t_1$ and $t_2$, thereby obtaining the overvoltage reaction delay time.

$$\Delta t_{doff1} = t_2 - t_1$$

The second detection voltage value $U_b$ is set, and the time when the overvoltage IGBT and the reference port voltage of the IGBT $U_{CE}$ reach the second detection voltage value are recorded, which are respectively recorded as $t_3$ and $t_4$. The entire voltage rise time is predicted through the first detection voltage value $U_a$ and the second detection voltage value $U_b$, thereby obtaining the delay time that is generated due to the difference in voltage rise slope.

$$\Delta t_{doff2} = \frac{U_{total}}{n(U_b - U_a)}[(t_4 - t_2) - (t_3 - t_1)]$$

Specifically, $U_{total}$ is the total voltage of the serial IGBT, and n is the number of IGBTs connected in serial.

The amplitude of constant voltage supplied by the auxiliary voltage source is calculated through the following equation.

$$\Delta U = U_{on}\left[\exp\left(\frac{(t_2 - t_1) + \frac{U_{total}}{n(U_b - U_a)}[(t_4 - t_2) - (t_3 - t_1)]}{R_g(C_{ge} + C_{gc})}\right) - 1\right]$$

Specifically, $R_g$ is a gate resistance of the IGBT, $C_{ge}$ is a gate collector pole capacitance of the IGBT, $C_{gs}$ is a gate emitter pole capacitance of the IGBT, $U_{on}$ is a gate driving signal high level amplitude of the IGBT.

The invention further provides a serial IGBT voltage equalization system based on an auxiliary voltage source, including:

A detection module configured to detect a port dynamic voltage of each serial IGBT;

A diagnostic module configured to perform dynamic overvoltage diagnosis on the port dynamic voltage of each IGBT;

A high level signal supplying module configured to supply an emergency high level signal to the gate of the IGBT when a dynamic overvoltage exists in the port of one of the IGBT;

The auxiliary voltage source configured to supply a constant voltage to the gate of the IGBT when a dynamic overvoltage exists in the port of one of the IGBT.

The invention has the advantageous effects that the invention supplies a constant voltage through the auxiliary voltage source, prolongs the off time of the faulty IGBT, and turns off other IGBTs simultaneously, thereby achieving the purpose of serial IGBT voltage equalization. Compared with the existing technology, the invention has the advantages of simple principle, less difficulty for implementation, good voltage equalization effect, high stability, low power consumption and so on.

BRIEF DESCRIPTION OF THE DRAWINGS

The present invention will be further described below with reference to the accompanying drawings and embodiments, in which.

DESCRIPTION OF THE EMBODIMENTS

Figure 1:
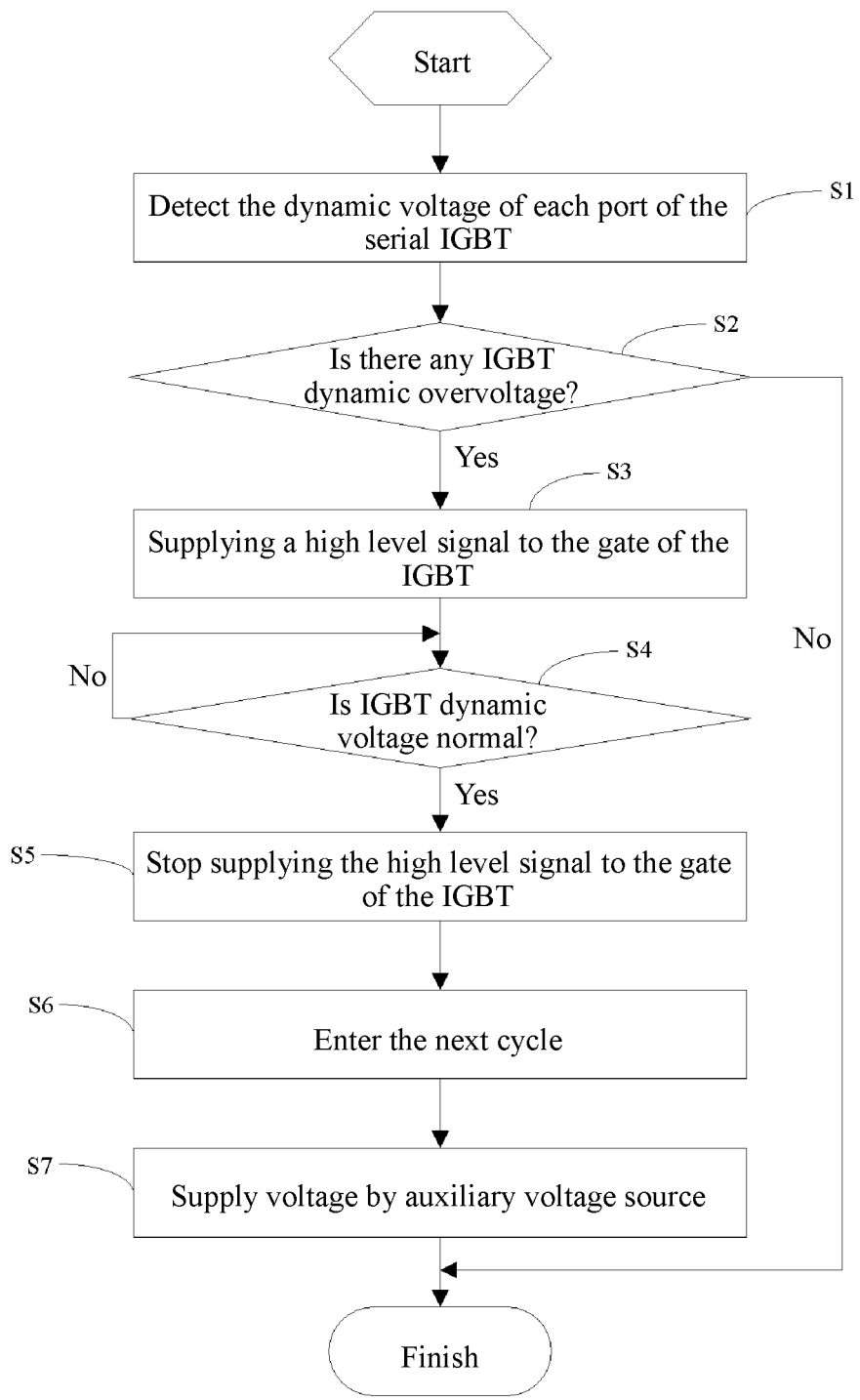
FIG. 1 is a flow chart of a serial IGBT voltage equalization method based on an auxiliary voltage source according to an embodiment of the present invention.

In order to make the purpose, technical solutions and advantages of the present invention more comprehensible, the present invention will be further described in detail below with reference to the accompanying drawings and embodiments. It should be understood that the specific embodiments described herein are merely illustrative of the invention and are not intended to limit the invention.

The serial IGBT voltage equalization method based on the auxiliary voltage source according to the embodiment of the invention includes the following steps:

(1) detecting the dynamic voltage of each port of the serial IGBT;

(2) performing IGBT dynamic overvoltage diagnosis;

(3) supplying a high level signal to one of the IGBT gate when a dynamic overvoltage is detected;

(4) supplying a constant voltage at the gate of the IGBT.

In the step (1), the specific method for detecting the dynamic voltage of each port of the serial IGBT is to input a port voltage value of the IGBT into the controller through the voltage dividing circuit.

In a preferred embodiment of the present invention, in step (2), the specific method of dynamic overvoltage diagnosis is as follows.

(2-1) Assuming that there are n IGBTs connected in series in the circuit, the overvoltage diagnosis is now performed on the i-th IGBT, and the criterion for diagnosis is $U_i>1.1U_{ref}$, and the IGBT satisfying this criterion is diagnosed as having overvoltage. Specifically, $U_{ref}$ is a reference voltage, and the coefficient before $U_{ref}$ can be selected as any value between 1 and 2. If the coefficient is too large, a safety issue will occur to the device; if the coefficient is too small, it is likely to have misjudgment. In the embodiment of the present invention, the selected value is 1.1, and the preferred range is 1.1 to 1.5. The reference voltage $U_{ref}$ can be an average value of all serial IGBT port voltages excluding the IGBT, or can be directly selected according to the IGBT model by looking up the manufacture manual.

(2-2) It is required that diagnosis is started when the IGBT gate voltage reaches the Miller platform.

In step (3), the specific method of supplying a high level signal to the gate of the IGBT is as follows:

(3-1) The signal amplitude $U_A=U_{on}-U_m$, where $U_{on}$ is the high-level amplitude of the gate driving signal of the IGBT, and $U_m$ is the voltage amplitude of the Miller platform of the IGBT.

(3-2) The signal width is determined by the port voltage diagnosis result of the IGBT. When the criterion $U_i \leq U_{ref}$ is satisfied, the signal stops.

In step (4), the specific method of supplying an auxiliary voltage source to the gate of the IGBT is as follows.

(4-1) The auxiliary voltage source starts operating in the next cycle after step (3).

(4-2) The detection voltage value $U_a$ is set to be close to 0, the time when the overvoltage IGBT and the reference port voltage of the IGBT $U_{CE}$ reach the detection voltage value are recorded, which are respectively denoted as $t_1$ and $t_2$, thereby obtaining the overvoltage reaction delay time.

$$\Delta t_{doff1}=t_2-t_1$$

(4-3) The appropriate detection voltage value $U_b$ is set, the time when the overvoltage IGBT and the reference port voltage of the IGBT $U_{CE}$ reach the detection voltage value are recorded, which are respectively recorded as $t_3$ and $t_4$. The entire voltage rise time is predicted through $U_a$ and $U_b$, with a proportional coefficient as follows.

$$p = \frac{U_{total}}{n(U_b - U_a)}$$

Therefore, the fault voltage of the IGBT rise time $t_{rise1}$ and $t_{rise2}$ are respectively as follows.

$$t_{rise1}=p(t_3-t_1)$$

$$t_{rise2}=p(t_4-t_2)$$

Accordingly, the delay time that is generated due to the difference in voltage rise slope is obtained.

$$\Delta t_{doff2}=\frac{U_{total}}{n(U_b-U_a)}[(t_4-t_2)-(t_3-t_1)]$$

Specifically, $U_{total}$ is the total voltage of the port of the serial IGBT.

(4-4) According to equation for IGBT turn-off delay time $$t_{doff} = R_g(C_{ge} + C_{gc})\ln\left(\frac{g_m U_{on}}{g_m U_{ge(th)} + i_c}\right)$$

Specifically, $R_g$ is a gate resistance of the IGBT, $C_{ge}$ is a gate collector pole capacitance of the IGBT, $C_{gs}$ is a gate emitter pole capacitance of the IGBT, $g_m$ is the transconductance of the device, $U_{ge(th)}$ is the gate threshold voltage, and $i_c$ is the collector current.

Then the relationship between the turn-off delay time of the IGBT and the auxiliary voltage is as follows.

$$\Delta t_{doff} = \Delta t_{doff1} + \Delta t_{doff2} = R_g(C_{ge} + C_{gc})\ln\frac{U_{on}+\Delta U}{U_{on}}$$

The equation that the auxiliary voltage source supplies the constant voltage amplitude is obtained.

$$\Delta U = U_{on}\left[\exp\left(\frac{(t_2-t_1)+\frac{U_{total}}{n(U_b-U_a)}[(t_4-t_2)-(t_3-t_1)]}{R_g(C_{ge}+C_{gc})}\right)-1\right]$$

Through the total off-time difference of the IGBT obtained by two detection voltages, and the off-time of the faulty IGBT is extended through the constant voltage supplied by the auxiliary voltage source, and the other IGBTs are turned off simultaneously, it is possible to achieve the purpose of serial IGBT voltage equalization.

Referring to FIG. 1, the specific process of this embodiment is as follows:

Step S1: detecting dynamic voltages of each port of the serial IGBT;

Step S2: performing a dynamic overvoltage diagnosis of the IGBT, if the overvoltage criterion is not met, then the diagnosis is finished; if the overvoltage criterion is met, step S3 is performed;

Step S3: supplying a high level signal to the gate of the IGBT;

Step S4: performing the dynamic voltage diagnosis of the IGBT, when the normal voltage criterion (i.e., $U_i \leq U_{ref}$) is satisfied, step S5 is performed;

Step S5: stopping supplying a high level signal to the IGBT gate;

Step S6: entering the next cycle;

Step S7: at the beginning of the next cycle, the auxiliary voltage source supplies a constant voltage to the gate.

Figure 2:
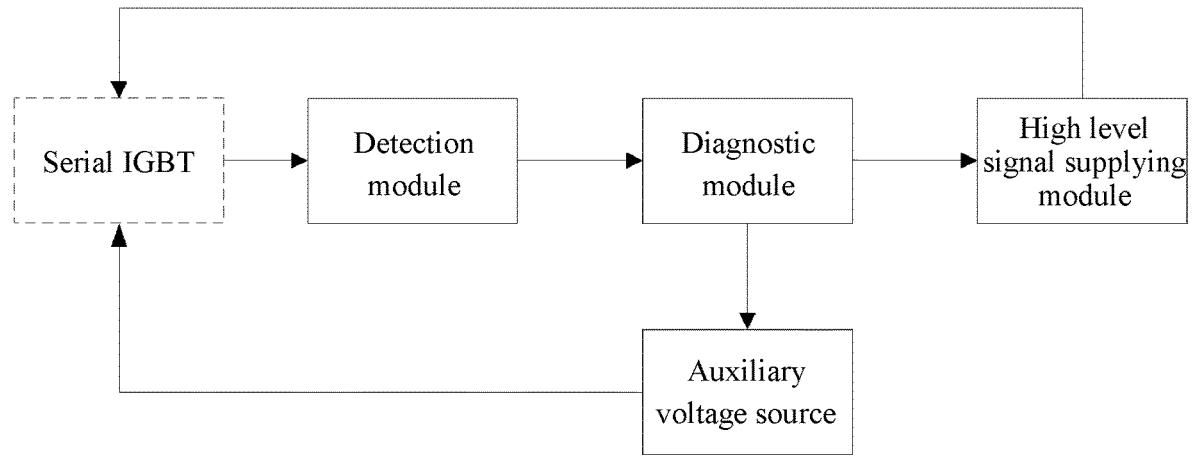
FIG. 2 is a schematic structural view 1 of a serial IGBT voltage equalization system based on an auxiliary voltage source according to an embodiment of the present invention.

In order to implement the method of the above embodiment, the present invention further provides a serial IGBT voltage equalization system based on an auxiliary voltage source. As shown in FIG. 2, the system includes the following.

A detection module is configured to detect a port dynamic voltage of each serial IGBT.

A diagnostic module is configured to perform dynamic overvoltage diagnosis on the port dynamic voltage of each of the IGBT.

A high level signal supplying module is configured to supply an emergency high level signal to the gate of the IGBT when a dynamic overvoltage exists in the port of the IGBT.

An auxiliary voltage source is configured to supply a constant voltage to the gate of the IGBT when a dynamic overvoltage exists in the port of one IGBT.

Figure 3:
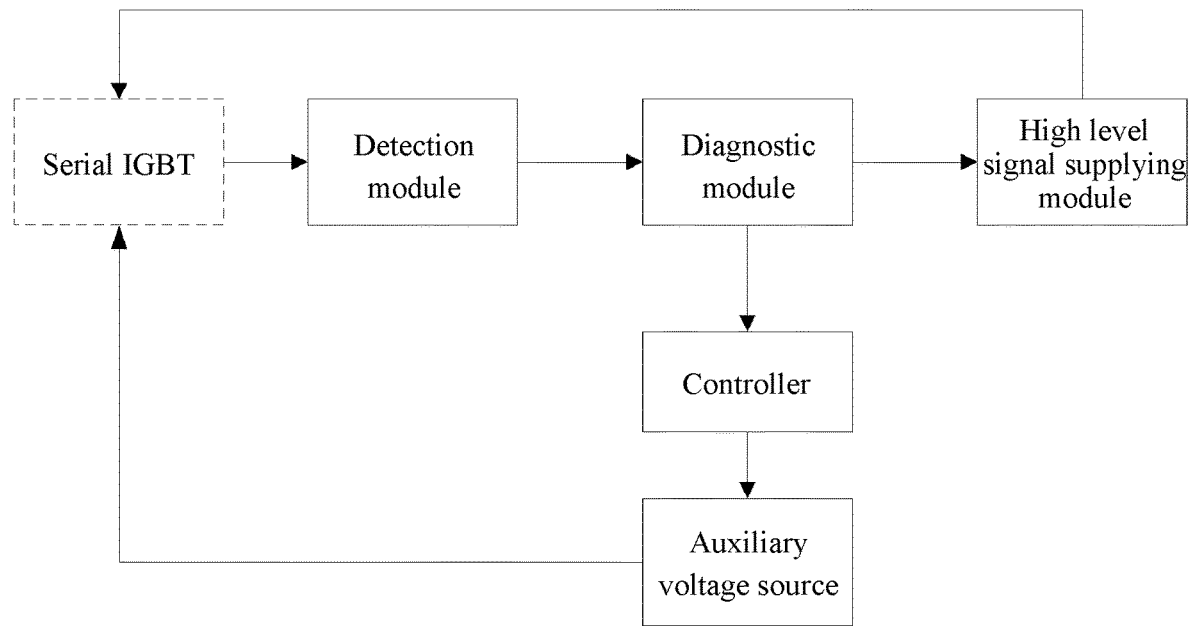
FIG. 3 is a schematic structural view 2 of a serial IGBT voltage equalization system based on an auxiliary voltage source according to an embodiment of the present invention.

As shown in FIG. 3, a controller can be provided between the diagnostic module and the auxiliary voltage source. The given voltage of the auxiliary voltage source is calculated by inputting $t_1$, $t_2$, $t_3$, $t_4$ and the signal is outputted to the controlled auxiliary voltage source.

The invention provides a simple and effective serial IGBT voltage equalization method, which realizes serial IGBT voltage equalization in the case where the IGBT is turned off and the voltage rising slope is not large, thereby improving the operation reliability of high-power IGBT. The advantages are the following: the principle is simple, the implementation is less difficult, the voltage equalization effect is good, stability is high and power consumption is low and so on.

It should be understood that those skilled in the art can make modifications or changes in accordance with the above description, and all such modifications and changes still fall within the scope of the appended claims.

What is claimed is:

1. A serial insulated gate bipolar transistor (IGBT) voltage equalization method based on an auxiliary voltage source, comprising the following steps:
   (1) detecting a collector-emitter dynamic voltage between a collector and an emitter of each of a serial IGBT, wherein the serial IGBT comprises at least two IGBTs;
   (2) performing a dynamic overvoltage diagnosis on the collector-emitter dynamic voltage of each of the serial IGBT;
   (3) supplying an emergency high level signal to a gate of one of the serial IGBT when a dynamic overvoltage is detected;
   (4) stopping supplying the emergency high level signal to the gate of the one of the serial IGBT, and supplying a constant voltage at the gate of the one of the serial IGBT through the auxiliary voltage source,
   wherein the method for determining a constant voltage supplied by the auxiliary voltage source is:
   setting a first detection voltage value $U_a$ to be close to 0, recording a time when an overvoltage IGBT and a reference voltage of the overvoltage IGBT $U_{CE}$ reach the first detection voltage value, which are respectively recorded as $t_1$ and $t_2$, thereby obtaining an overvoltage reaction delay time;

$$\Delta t_{doff1} = t_2 - t_1$$

setting a second detection voltage value $U_b$, recording a time when the overvoltage IGBT and the reference voltage of the overvoltage IGBT $U_{CE}$ reach the second detection voltage value, which are respectively recorded as $t_3$ and $t_4$; predicting the entire voltage rise time through the first detection voltage value $U_a$ and the second detection voltage value $U_b$, thereby obtaining a delay time generated due to a difference in voltage rise slope:

$$\Delta t_{doff2} = \frac{U_{total}}{n(U_b-U_a)}[(t_4-t_2)-(t_3-t_1)]$$

wherein $U_{total}$ is a total voltage of the serial IGBT, and n is the number of IGBTs connected in series;

wherein an amplitude of the constant voltage supplied by the auxiliary voltage source is calculated through the following equation:

$$\Delta U = U_{on}\left[\exp\left(\frac{(t_2-t_1)+\frac{U_{total}}{n(U_b-U_a)}[(t_4-t_2)-(t_3-t_1)]}{R_g(C_{ge}+C_{gc})}\right)-1\right]$$

wherein $R_g$ is a gate resistance of the overvoltage IGBT, $C_{ge}$ is a gate collector pole capacitance of the overvoltage IGBT, $C_{gc}$ is a gate emitter pole capacitance of the overvoltage IGBT, $U_{on}$ is a gate driving signal high level amplitude of the overvoltage IGBT.

2. The serial IGBT voltage equalization method based on the auxiliary voltage source according to claim 1, wherein the dynamic voltage is diagnosed as dynamic overvoltage when the collector-emitter dynamic voltage of one of the IGBT exceeds a reference voltage by a specific ratio.

3. The serial IGBT voltage equalization method based on the auxiliary voltage source according to claim 2, wherein a signal width of the high level signal is determined by a collector-emitter voltage diagnosis result of the overvoltage IGBT, and when the collector-emitter dynamic voltage of the overvoltage IGBT is less than or equal to the reference voltage, the high level signal stops.

4. The serial IGBT voltage equalization method based on the auxiliary voltage source according to claim 1, wherein in step (4), the auxiliary voltage source starts operating in a next cycle of stopping supplying the high level signal to the gate of the overvoltage IGBT.

5. A serial insulated gate bipolar transistor (IGBT) voltage equalization system based on an auxiliary voltage source, comprising:
  a detection module configured to detect a collector-emitter dynamic voltage between a collector and an emitter of each of a serial IGBT, wherein the serial IGBT comprises at least two IGBTs;
  a diagnostic module configured to perform a dynamic overvoltage diagnosis on the collector-emitter dynamic voltage of each of the serial IGBT;
  a high level signal supplying module configured to supply an emergency high level signal to a gate of one of the serial IGBT when a dynamic overvoltage exists between the collect and the emitter of the one of the serial IGBT;
  the auxiliary voltage source configured to supply a constant voltage to the gate of the one of the serial IGBT when the dynamic overvoltage exists between the collect and the emitter of one of the one of the serial IGBT,
  wherein the method for determining a constant voltage supplied by the auxiliary voltage source is:
    setting a first detection voltage value $U_a$ to be close to 0, recording a time when an overvoltage IGBT and a reference collector-emitter voltage of the overvoltage IGBT $U_{CE}$ reach the first detection voltage value, which are respectively recorded as $t_1$ and $t_2$, thereby obtaining an overvoltage reaction delay time;

$$\Delta t_{doff1} = t_2 - t_1$$

setting a second detection voltage value $U_b$, recording a time when the overvoltage IGBT and the reference collector-emitter voltage of the overvoltage IGBT $U_{CE}$ reach the second detection voltage value, which are respectively recorded as $t_3$ and $t_4$; predicting the entire voltage rise time through the first detection voltage value $U_a$ and the second detection voltage value $U_b$, thereby obtaining a delay time generated due to a difference in voltage rise slope:

$$\Delta t_{doff2} = \frac{U_{total}}{n(U_b - U_a)}[(t_4 - t_2) - (t_3 - t_1)]$$

wherein $U_{total}$ is a total voltage of the serial IGBT, and n is the number of IGBTs connected in series;

wherein an amplitude of the constant voltage supplied by the auxiliary voltage source is calculated through the following equation:

$$\Delta U = U_{on}\left[\exp\left(\frac{(t_2 - t_1) + \frac{U_{total}}{n(U_b - U_a)}[(t_4 - t_2) - (t_3 - t_1)]}{R_g(C_{ge} + C_{gc})}\right) - 1\right]$$

wherein $R_g$ is a gate resistance of the overvoltage IGBT, $C_{ge}$ is a gate collector pole capacitance of the overvoltage IGBT, $C_{gc}$ is a gate emitter pole capacitance of the overvoltage IGBT, $U_{on}$ is a gate driving signal high level amplitude of the overvoltage IGBT.

* * * * *